US005092029A

United States Patent [19]

Fisher et al.

[11] Patent Number: 5,092,029

[45] Date of Patent: Mar. 3, 1992

[54] APPARATUS FOR LOADING PINS FOR CIRCUIT BOARDS

[75] Inventors: James Fisher, Georgetown; Michael R. Bishop, Ottawa; Claus Balkenhol, Islington, all of Canada

[73] Assignee: Northern Telecom Limited, Montreal, Canada

[21] Appl. No.: 515,954

[22] Filed: Apr. 27, 1990

[51] Int. Cl.[5] .......... H05K 3/30

[52] U.S. Cl. .......... 29/739; 29/747; 29/845

[58] Field of Search .......... 29/739, 747, 741, 759, 29/842, 845

[56] References Cited

U.S. PATENT DOCUMENTS 4,316,321 2/1982 Wickham .......... 29/739 X 4,598,471 7/1986 Elsbree, Jr. et al. .......... 29/845

*Primary Examiner*—Carl E. Hall

*Attorney, Agent, or Firm*—R. J. Austin

[57] ABSTRACT

An apparatus and method for removing pins from a bandolier type carrier and for loading groups of pins into a carrier block, for insertion into printed circuit boards. A bandolier carrying pins is moved along a passline and a group of a desired number of the bandoliered pins is positioned in a pin loading station of the apparatus. The pins are held by opposed gripping members, which are relatively movable towards each other into pin holding positions and are then operable to cause relative movement of the bandolier and the group of pins laterally of the passline, thereby separating the pins from the bandolier. While pins of the group are held by the gripping members, relative movement of the carrier block and the group of pins causes ends of the pins to be received in pin receiving locations in the carrier block. The pins are then released by moving the gripping members apart so that the pins remain in the carrier block.

11 Claims, 9 Drawing Sheets

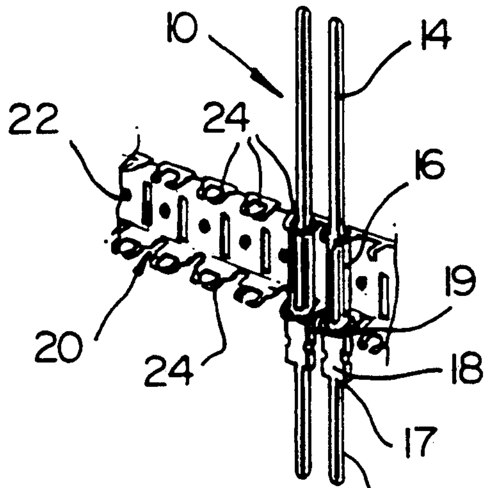
FIG. 1
PRIOR ART
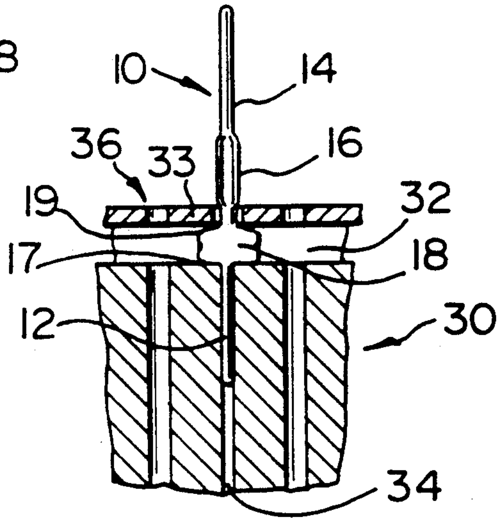
FIG. 2B
PRIOR ART
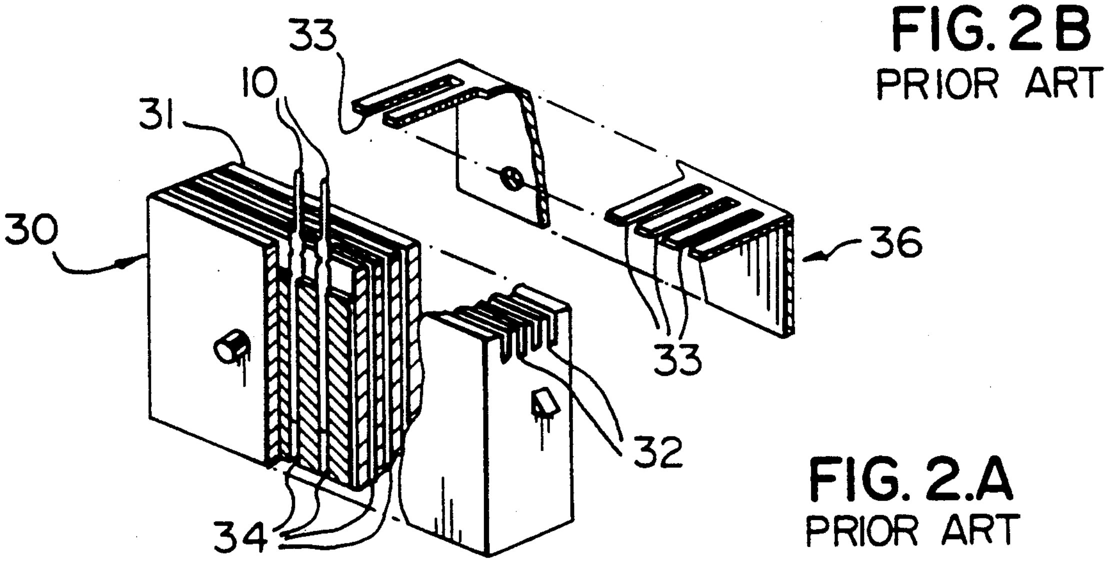
FIG. 2.A
PRIOR ART

APPARATUS FOR LOADING PINS FOR CIRCUIT BOARDS

This invention relates to an apparatus and method for removing pins from a bandolier type carrier and for loading groups of pins into a pin holder, e.g. a carrier block, for insertion into printed circuit boards.

Pins are conventionally inserted into printed circuit boards by carrying the pins oriented vertically and held at one end by a punch which forces them downwards into aligned holes in the circuit board. The pins are inserted individually and sequentially into their respective holes.

Pins may be supplied from continuous reels of pins mounted on an end carrier. Sections of end carrier with pins of one or more types are pre-cut from the reels, and the pins are removed and loaded manually in the required sequence. Care must be taken by the operator to ensure that the end carrier is removed gently to avoid pin tip burrs. Alternatively, the pins may be supplied from reels of pins mounted on a bandolier type carrier. U.S. Pat. No. 3,699,631 to Shughart discloses an apparatus for removing individual pins from a bandolier and, by means of a punch, for inserting individual pins sequentially into a printed circuit board.

In the apparatus of Shughart, pins carried on a bandolier type carrier are fed along a passline to position a pin underneath the punch, the punch moves down to grip the end of the pin and the bandolier is moved laterally to shear off the pin from the bandolier. The punch then moves further downward to push the other end of the pin into an aligned hole in a circuit board.

With this process there is a problem with aligning ends of pins with the circuit board and forcing them into the board from a long distance away, i.e. from their opposite ends, and pin breakage and twisting during insertion may result. Also, about 10,000 pins may be required in a circuit board for an entire backpanel assembly, and sequential insertion of one pin at a time is time consuming.

In another known pin loading apparatus, groups of pins are inserted simultaneously into a circuit board. Pins carried on a bandolier are fed into a holding station where opposed jaws grasp a group of pins, a movable member of one jaw moves the bandolier laterally of the pins to detach the pins and then a punch moves downwards to engage around and grip upper ends of the pins of the group. Holes in the circuit board are aligned beneath. The jaws move apart to release the pins, which remain gripped by the punch, and then the punch moves further downwards so as to lower the pins towards the circuit board and insert the lower ends of the pins into the board. Movement of the jaws is provided by cam edge grooves. In the prior use, the pins are compliant pins and the compliant sections of the pins are received within holes in the circuit board. The compliant portions of the pins engage the circuit board so that the pins are gripped more strongly in the circuit board than by the punch. Thus, the pins are retained in the circuit board on withdrawal of the punch. The time required to insert an array of pins is significantly reduced by simultaneous insertion of groups of pins. However, problems of breakage and twisting may still arise while pushing lower ends of the pins into the circuit board from upper ends of the pins.

Copending Canadian Patent Application No. 604,292, filed June 28, 1989 in the names of J. Fisher, C. Balkenhol and L. Roberts, entitled "Inserting Pins Into Printed Circuit Boards", discloses an apparatus and method for inserting pins into printed circuit boards in which multiple pins are inserted simultaneously into corresponding holes in a printed circuit board: all of the pins are first placed and held in a carrier block in a pre-arranged configuration of holes in the carrier block which corresponds to the arrangement of holes in the circuit board. Then, the carrier block is inverted and located with the pins vertically above the holes in the circuit board. The carrier is located in a stationary position with ends of the pins aligned with and received in the holes in the board and, by means of a press, the carrier block engages abutment shoulders of the pins and forces the pins into their aligned holes. Use of a carrier block for insertion of pins is found to significantly reduce pin twisting and breakage and damage to circuit boards.

New technology requires increased pin counts per circuit board upwards of 15,000 as well as inclusion of several different types of pin in intermixed arrays of pins. There may be, for example, 180 advance and signal pins in each carrier block, arranged in a $4\times45$ array. Several types of pins may be used for each array. Each of the pins of the intermixed pin configurations, are manually located in the carrier block arrays as per a reference drawing. The pins must be oriented in the same direction with no pins damaged or missing. The carrier blocks are then presented to a press operator for insertion of the pins into a backpanel, ie a circuit board. However, in order to obtain high pin insertion yields, it is necessary to have a reliable method of correctly inserting pins into a multi-pin carrier block.

Known apparatus, as described above, for loading groups of compliant pins into a circuit board using a punch that engages and grips ends of the pins cannot be used to load pins into a carrier block because it is required that the pins are held loosely in the carrier block to allow them to be released from the block and remain in the circuit board after insertion thereinto. Thus removal of the punch which grips the pins would merely remove the loose fitting pins from the carrier block. The known apparatus and process steps require that pins are inserted and firmly retained by a circuit board so that ends of the pins are pulled out of engagement with the punch when it is withdrawn. Therefore, known apparatus and process steps are unworkable for the present application which requires the pins to be inserted and held releasably and slidably in the carrier block.

The present invention seeks to provide a method and apparatus for loading pins into a carrier block, and which overcomes the above problem.

According to one aspect of the present invention, there is provided an apparatus for loading pins into a carrier block, the apparatus including a pin loading station and comprising: means for intermittently moving a bandolier along a passline through the pin loading station to locate groups of pins carried on the bandolier sequentially in the pin loading station means for gripping pins of a group in the pin loading station, the gripping means having opposed gripping members which are relatively movable towards each other into pin holding positions to hold the pins and away from the pin holding positions to release the pins; bandolier separating means operable to cause relative movement of the bandolier and pins of the group held in the loading station when the gripping members are in the holding positions whereby the bandolier is detached from the group of pins; and, carrier block positioning means, having a support for the carrier block, the carrier block positioning means and the gripping members being operable to cause relative movement of the gripping members and the support from positions apart to positions closer together while the gripping members are in the holding positions, to cause ends of pins of a group held in the pin loading station to be received in pin receiving locations within the carrier block, the gripping members then being movable away from the pin holding positions to release the pins with the gripping members and the support in their positions closer together.

Thus, one aspect of the present invention provides an apparatus for automatically and controllably removing groups of a predetermined number of pins from a bandolier and positioning and loading the groups of pins into pin receiving locations in the carrier block. For this purpose, the various parts of the apparatus, e.g. the pin gripping means and the bandolier separating means, may be of any construction consistent with their required function as defined above in the apparatus of the present invention. In this required function, the pin gripping means positively holds the pins during separation of the bandolier and while the pins are being inserted into the block, and then the gripping members are moved away from each other. This latter movement ensures that the pins are released by the gripping members so that the ends of the pins remain in the carrier block and are not removed by the pin gripping members. The above mentioned problems associated with labour intensive and time consuming manual loading of pins into a carrier block are thereby reduced.

In a preferred arrangement of the inventive apparatus, useful for sequentially loading a plurality of groups of pins into spaced pin receiving location in a carrier block, at least one of the gripping members is formed with an apertured region. In use, during movement of the carrier block support and the gripping members to their positions closer together to load a group of pins into their pin receiving locations in the carrier block, the apertured region allows ends of a preceding group of pins inserted into and projecting from the carrier block to pass into the apertured region, Thus, the gripping members and the carrier block support can be brought into their positions closer together for loading the pins into the carrier block without the preceding group(s) of pins contacting the gripping members.

With the above preferred arrangement, to allow for sequential loading of groups of pins, the carrier block positioning means may be operable so as to move the carrier block, after each loading operation to dispose vacant pin receiving locations in desired positions for receiving a subsequent group of pins. However, preferably, movement of the gripping members is controlled so that they are movable in their relative pin holding positions, selectively to any of a plurality of desired locations, laterally of the passline, so as to align a succeeding group of pins with vacant pin receiving locations of the pin carrier. Conveniently, this movement is controllable by stepper motors operably connected to the gripping members, with operation of the stepper motors themselves being computer controlled.

According to another aspect of the present invention, there is provided an apparatus for loading a plurality of groups of pins into a carrier block, the apparatus having a plurality of pin loading stations, and comprising in respect of each pin loading station: means for intermittently moving a bandolier along a passline through the pin loading station to locate groups of pins carried on the bandolier sequentially in the pin loading station; means for gripping pins of a group in the pin loading station, the gripping means having opposed gripping members which are relatively movable towards each other into pin holding positions to hold the pins and away from the pin holding positions to release the pins; and bandolier separating means operable to cause relative movement of the bandolier and pins of the group held in the pin loading station when the gripping members are in the holding positions whereby the bandolier is detached from pins; and, the apparatus also including carrier block positioning means, having a support for the carrier block, the carrier block positioning means being operable to move the support from one pin loading station to another and with the support disposed in any particular pin loading station, the support and the gripping members are relatively movable from positions apart to positions closer together while the gripping members are in their holding positions, to cause ends of pins of a group held in the particular pin loading station to be received in pin receiving locations within the carrier block, the gripping members then being movable from the pin holding positions with the gripping members and the support in their positions closer together.

Thus, by shuttling the carrier block between loading stations under computer control, complex arrays of several different types of pins can be loaded reliably into a single carrier block, without significantly increasing loading time. Automatically controlled operation reduces errors due to operator fatigue resulting from the labour intensive nature of manually loading large numbers of pins.

According to a further aspect of the invention, there is provided a method of loading pins into a carrier block, the method comprising: moving a bandolier carrying pins along a passline and positioning a group of a desired number of the bandoliered pins in a pin loading station along the passline; moving pin gripping members towards each other from each side of the passline and into pin holding positions to hold the pins of the group in the pin loading station; causing relative movement of the bandolier and the group of pins laterally of the passline while the pins are held by the gripping members thereby separating the pins of the group from the bandolier; with the group of pins still held by the gripping members, relatively moving the carrier block and the group of pins so as to cause ends of the pins to be received in pin receiving locations in the carrier block; and then releasing the pins by moving the gripping members apart, the pins remaining in the carrier block.

Embodiments of the invention will now be described by way of example, with reference to the accompanying drawings, in which:

FIG. 1 shows a perspective view of conventional compliant pins held in a bandolier of prior art structure;

FIG. 2A is a cut away perspective view of a carrier block of prior art structure; FIG. 2B is a cross sectional view on a larger scale than FIG. 2A, of part of the carrier block of prior art structure, holding a compliant pin.

Figure 3:
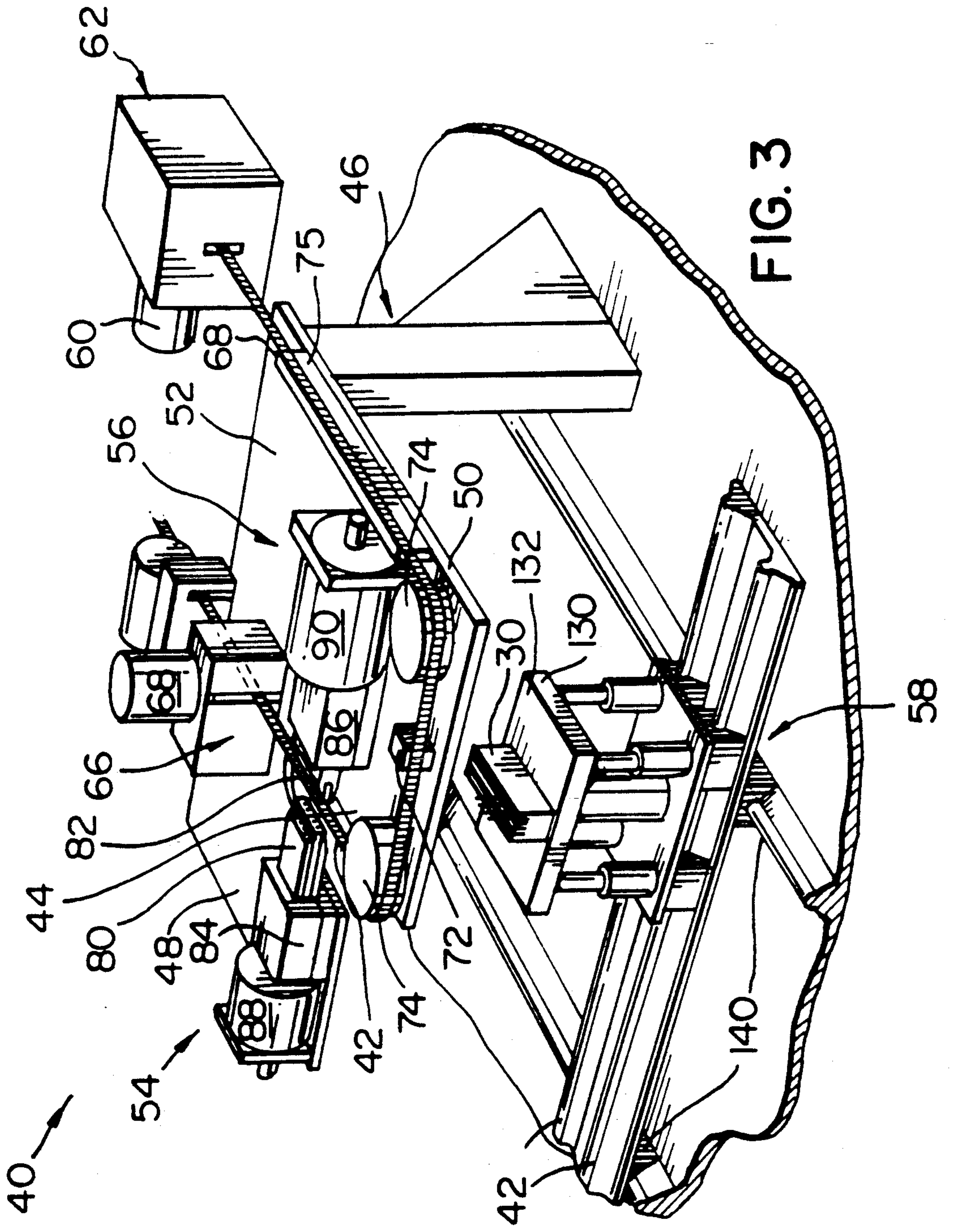
FIG. 3 is a perspective view of an apparatus according to a first embodiment of the present invention.

An example of a type of bandolier 20 of conventional structure carrying circuit board pins 10, which is suitable for use with the apparatus and method of the embodiments to be described, is shown in FIG. 1.

Pins 10 (FIG. 1) are of the type known as compliant pins and are of conventional structure, comprising opposite aligned end portions 12 and 14, and between the end portions a compliant portion 16 for resiliently engaging a hole in a circuit board and an abutment portion 18 of greater lateral dimension providing abutment shoulders 17 and 19. The bandolier 20 comprises an elongate flexible supporting strip 22 providing a linear array of spaced apart pairs of claws 24 which engage end portions 12 and 14 of the pins adjacent each end of the compliant portion 16 of the pins so as to hold the pins parallel and spaced apart a desired distance along the bandolier. A continuous strip of bandolier carrying pins is generally supplied on a reel.

A carrier block 30 of the type disclosed in copending Canadian Patent Application No. 604,292, and suitable for use with the apparatus of the embodiments to be described, is shown in FIG. 2A. The carrier block 30 is formed along one side 31 with four rectangular section slots 32. From the bases of the slots 32, individual holes 34 extend further into the carrier block 30. The holes 34 are location holes for slidable reception of end portions 12 of circuit board pins 10, illustrated in FIG. 1. The holes are in four rows, one row to each slot 32, each slot 32 having 45 holes so as to form a 4×45 array of holes. The distances between the rows of holes and between holes in each row correspond to distances between holes in a printed circuit board into which pins are to be inserted. A retainer 36 is used to retain pins in respective holes 34 after insertion into the carrier block. The retainer 36 has fingers 33 receivable between pins held in the carrier block and for engaging abutment shoulders 19 of the pins and the fingers 33 are slidably disposed along the side 31 of the carrier block 30. When pins 10 are received in the carrier block as shown in FIG. 2B, abutment shoulders 17 hold the pins at a desired depth into the slots 32 and, when retainer 36 is in position and the carrier block 30 is inverted, as for inserting pins into a circuit board, abutment shoulders 19 prevent the pins 10 from slidably falling from the carrier block 30 until the retainer 36 is removed. In use of the carrier block for insertion of pins into a circuit board, the carrier block is inverted with ends of pin end portions 14 inserted into holes in the board and the retainer is then removed. The carrier block engages abutment shoulders 17 of the abutment portion 18 of the pins and a force is applied to the carrier block so as to push the compliant portion 16 of the pins 10 into the circuit board. This use is described in copending Canadian Application No. 604,292.

An apparatus 40 for loading pins 10 into the carrier block 30 and according to a first embodiment of the present invention, as shown in FIG. 3, generally comprises a pin loading station 44 disposed about a passline 42 for a bandolier 20, carrying spaced apart pins 10. The apparatus has a supporting frame 46 upon which is provided means for intermittently moving the bandolier along the passline 42 through the pin loading station 44 so as to locate groups of pins 10 carried on the bandolier sequentially in the pin loading station 44, as will be described below. In the loading station 44 is also provided a pair of opposing heads 54 and 56, which, as will be described, include mounting blocks 84 and 86 and motorized drive means 88 and 90 for combined bandolier separating means and pin gripping means comprising a pair of operating members 80 and 82. Also included is a means 58 for positioning a carrier block relative to the bandolier separating means and pin gripping means 80 and 82 for insertion of pins held in the gripping means into the carrier block 30.

The apparatus will now be described in greater detail with reference to FIGS. 3 to 8.

Horizontally spaced arms 48 and 50 of a platform 52 of the supporting frame 46 for the opposing heads 54 and 56 carry mounting blocks 84 and 86 for the operating members 80 and 82.

Figure 4:
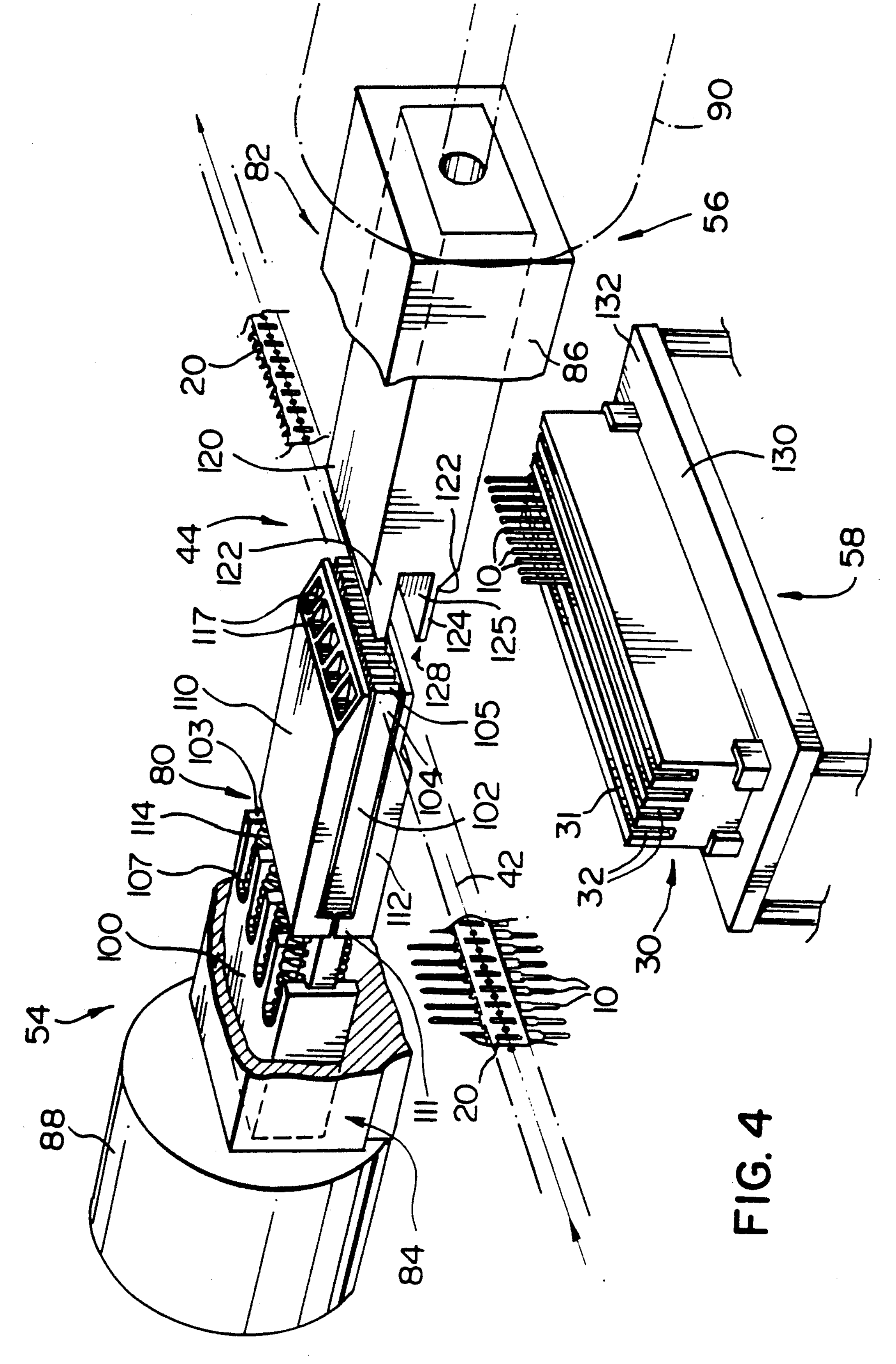
FIG. 4 is an enlarged perspective view of part of the apparatus according the first embodiment showing, along the passline, a bandolier carrying pins.

The operating member 80 comprises a rigid member having main rectangular body portion 100, slidably received within the mounting block 84, and which extends towards the passline 42 to provide a narrow planar portion 102, thereby forming shoulders 103 at the junction of the body portion 100 and the planar portion 102. The bandolier separating means comprises a plurality of elongate tines 104 which extend from the free end of the narrow planar portion 102 towards the passline. The tines 104 are spaced apart and of suitable dimensions to be receivable between pins carried on the bandolier. On opposite surfaces 106 and 108 of the narrow planar portion 102 are mounted gripping members 110 and 112 of the combined bandolier separating means and pin gripping means. The upper gripping member 110 and lower gripping member are retained in sliding engagement upon the narrow planar portion 102 by the mounting block 84 which encases not only the main body portion 100 but also part of the gripping members 110 and 112. Upper and lower pin gripping surfaces 126 are provided on ends 116 of the upper and lower gripping members 110 and 112. Compression springs 114 extend from spring receiving grooves 107 of the main body portion 100 and project from shoulders 103 and are received in holes 115 at ends 118 of the gripping members 110 and 112 so as to urge the gripping members 110 and 112 away from the main body portion 100 and towards the free ends 105 of the tines 104. In this position, and as shown in FIG. 4, ends 116 of the gripping members 110 and 112 are aligned with free ends 105 of the tines. Extension of the gripping members 110 and 112 beyond ends of the tines 105 is prevented by abutment shoulders 111 of the gripping members 110 and 112 which engage shoulders 109 of the narrow planar portion 102 of operating member 80, to limit sliding movement of the gripping members.

Operating member 82 has a rigid main body portion 120 which extends to tapered and parallel end portions or upper and lower gripping members 122, having free ends 124 defining upper and lower pin gripping surfaces 128, between which is defined an elongate recess 125 extending lengthwise of the passline. The main body portion 120 of operating member 82 is slidably received within mounting block 86. Pin gripping surfaces 128 define pin receiving grooves 129 to aid in positioning of pins gripped between the pin gripping surfaces 126 and 128 (and to prevent sideways movement of the pins during a loading operation).

Operating members 80 and 82 are opposed across the passline so that upper and lower gripping surfaces 128 of rigid member 82 oppose corresponding upper and lower gripping surfaces 126 of the gripping members 110 and 112 of operating member 80 and tines 104 of operating member 80 are aligned for reception within the recess 125. The gripping members 110/112 and 122 of operating members 80 and 82 are slidably movable towards one another into pin holding positions whereby a group of pins carried on a bandolier may be held between gripping surfaces 126 and 128. The supporting strip 22 of the bandolier 20 is receivable in the recess 125 between gripping surfaces 128 of the ends 124 of gripping means 82. Tines 104 of the operating member 80 may then extend between pins of the group to engage the bandolier. Edges of the gripping surfaces 126 are bevelled (not shown) so that claws 24 of the bandolier 20 are receivable between the tines 104 and the gripping members 110 and 112.

Figure 5:
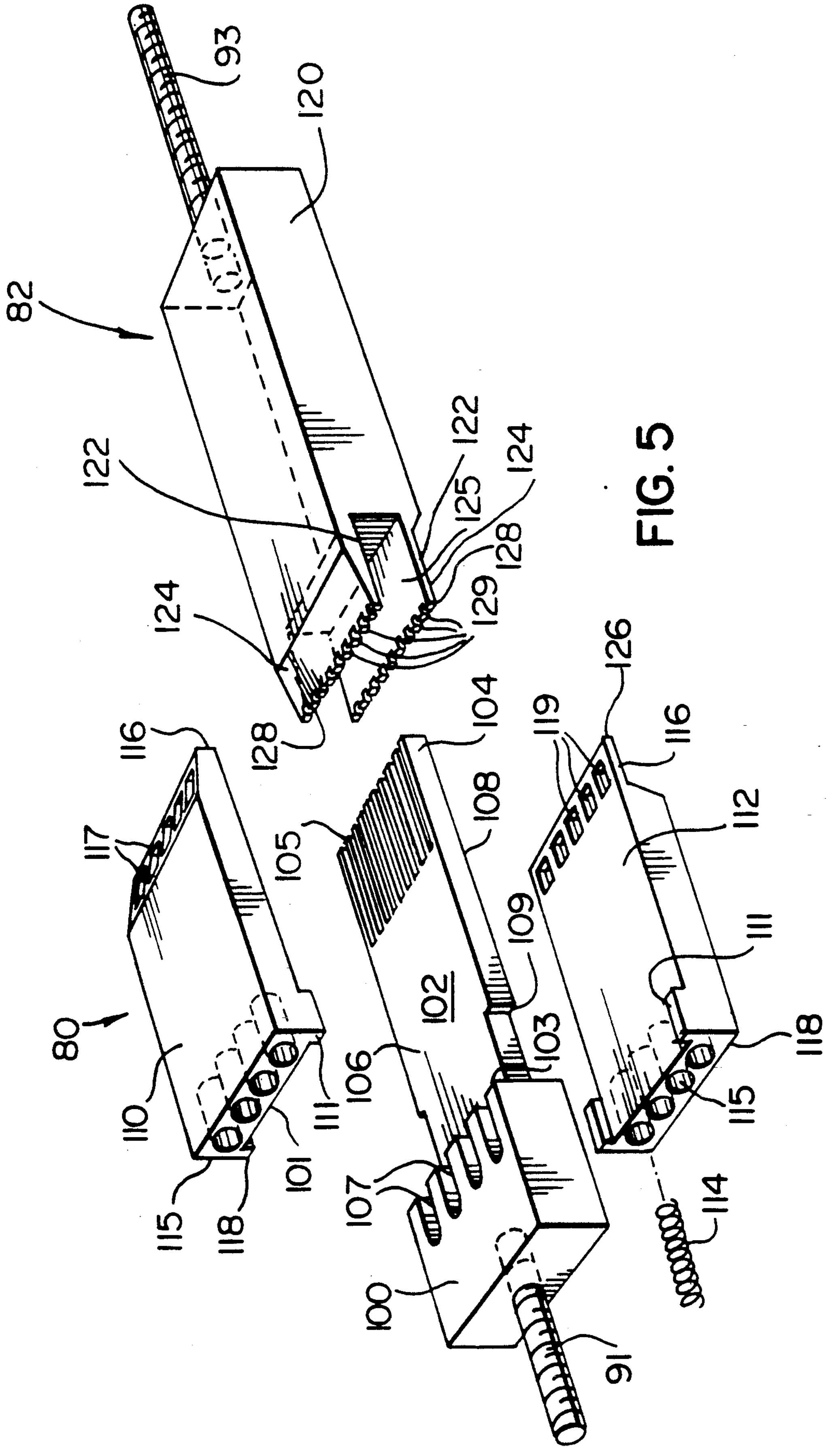
FIG. 5 is an exploded view of operating members of the apparatus according to the first embodiment.
Figures 6, 7:
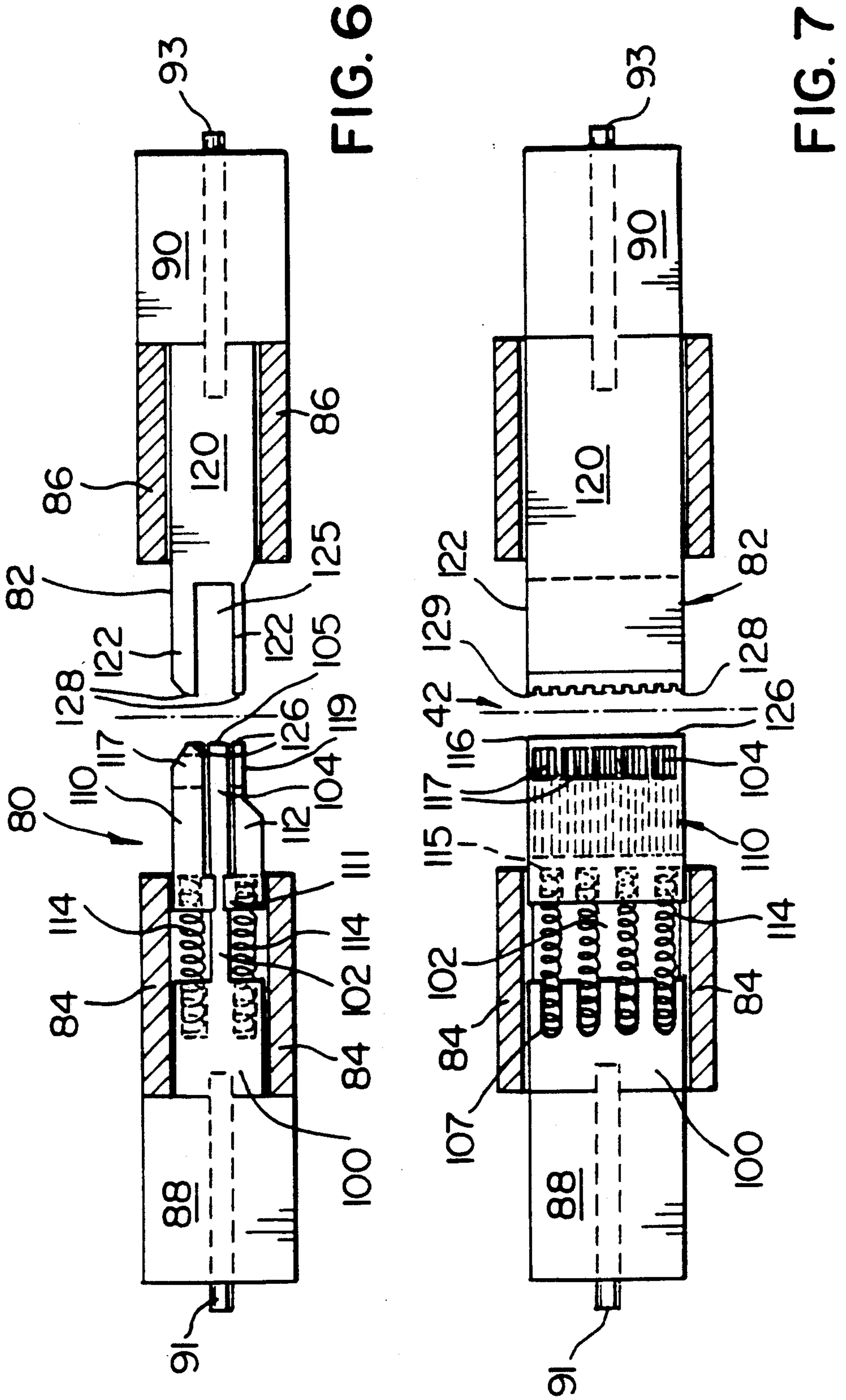
FIG. 6 is a side view of the operating members of the apparatus according to the first embodiment.
FIG. 7 is a top view of the operating members of the apparatus according to the first embodiment.

Motorized drive means for operating members 80 and 82 are micro-stepper motors 88 and 90 (FIGS. 3 and 4) preferably of the ball screw type, having a rotatable armature around a centre screw-threaded shaft 91 and 93 which is threaded into the armature and is rotatably received at one end within an end of the appropriate operating member 80 or 82 (FIG. 5). Armature rotation causes axial movement of the shaft to create horizontal movement of the corresponding operating member. Use of stepper motors of this type allows the operating members to be rapidly and accurately positioned under computer control. The position of the holding members is referenced to a zero position monitored by a Hall effect sensor.

Tines 104 are operable as bandolier separating means as follows. The gripping members 110 and 112 of operating member 80 are slidably movable towards the abutment surfaces 101 of the main body portion 100 by compression of the springs 114, so that the tines 104 extend beyond ends 116 and 118 of the gripping members 110 and 112. Thus, when operating members 80 and 82 are urged towards each other into a holding position, so as to bring together gripping surfaces 128 and 126 of the two members into the holding positions as described above, further movement towards one another of the main body portions 100 and 120 of the members results in compression of the springs 114 so that the gripping members 110 and 112 are urged towards the main body portion 100. In this position the tines 104 extend beyond the ends 116 of the gripping members and are received within the recess 125 of holding member 82. If bandoliered pins are held between members 80 and 82, relative movement of the tines between pins held between members 80 and 82 engages and moves the bandolier laterally of the pins and thereby separates pins of the group from the bandolier. Movement away from each other of main body portions 100 and 120 of the operating members 80 and 82 releases the springs 114 to that the gripping members 110 and 112 are urged away from main body portion 100 of operating member 80, so as to withdraw the tines from the recess, while leaving the gripping members in the holding positions with surfaces 126 and 12 urged into contact by the springs 114. Further movement apart of the main body portions 100 and 120 of operating members 80 and 82 is required to separate gripping surfaces 126 and 128 from the holding positions so as to release pins held between the members.

The bandolier moving means, also mounted on the supporting frame 46, and shown schematically in FIG. 3, comprises a drive means 60 for feeding bandolier 20 carrying pins 10 from a bandolier supply reel station 62, and a bandolier take up means 66 having a motorised drive means 68 for intermittently pulling bandolier 20 through the loading station 44. The drive means 60 includes a motor and slip clutch mechanism. The latter is operable to keep slack in the forward section of the reel and to control tension in the bandolier as it is supplied from a reel in the reel station 62 and moved through the loading station 44. The take-up drive means 68 is operable to pull the bandolier at a desired tension and accurately position a group of a desired number of bandoliered pins along the passline between the operating members 80 and 82 of the loading station 44. A proximity switch 72 is used to monitor tension in the bandolier and provide control of the clutch mechanism for the bandolier supply reel drive means 60.

Also mounted on support platform 52, are guide means, including guide wheels 74 and guide channels 75, for guiding the bandolier along the passline 42 from the supply reel station 62 into the loading station 44 between operating members 80 and 82. The drive means 60 and 68 for the bandolier moving means comprise computer controlled microstepper motors for accurate positioning of desired pins in the loading station under computer control.

The carrier block positioning means 58 (FIG. 3) comprises a movable support 130 spaced beneath the passline 42 and beneath the two operating members 80 and 82 and having a support surface 132 for holding a carrier block 30 such as that described above and shown in FIG. 2. The support 130 is mounted on motorized positioning stages, so as to be controllably movable, horizontally in directions parallel and perpendicular to the passline 42, and pneumatically movable vertically, towards and away from the passline. Thus, the support 130 is movable towards a waiting group of pins held in the loading station 44 and the carrier block support and the operating members 80 and 82 are relatively movable for loading a group of pins held between the operating members 80 and 82 into a carrier block mounted on an upper support surface 132 of the support 130.

The support 130 is movable on an air cushion bearing along a pair of guide rails 140 which extend beneath the passline 42 horizontally beyond each side of a vertical position directly beneath the two heads and along another pair of guide rails 142, which extend at right angles to and is slidably mounted on guide rails 140. Preferably, support 130 is movable by linear drive motors of the type having a direct coupling with the support 130 rather than a mechanical linkage, so as to reduce system inertia and friction and hence the power requirement of the system. The position of the support 130 for the carrier block is referenced to a zero position by means of a Hall effect sensor.

The movement of the carrier block positioning means 58 is controlled by computer in sequence with the movement of the operating members 80 and 82 and with movement of the bandolier 20 along the passline 42. The apparatus comprises a 7 motor open loop control system which is computer controlled for automatic sequential operation of the apparatus as follows and as shown schematically in FIG. 8.

Figures 8A, 8B, 8C, 8D:
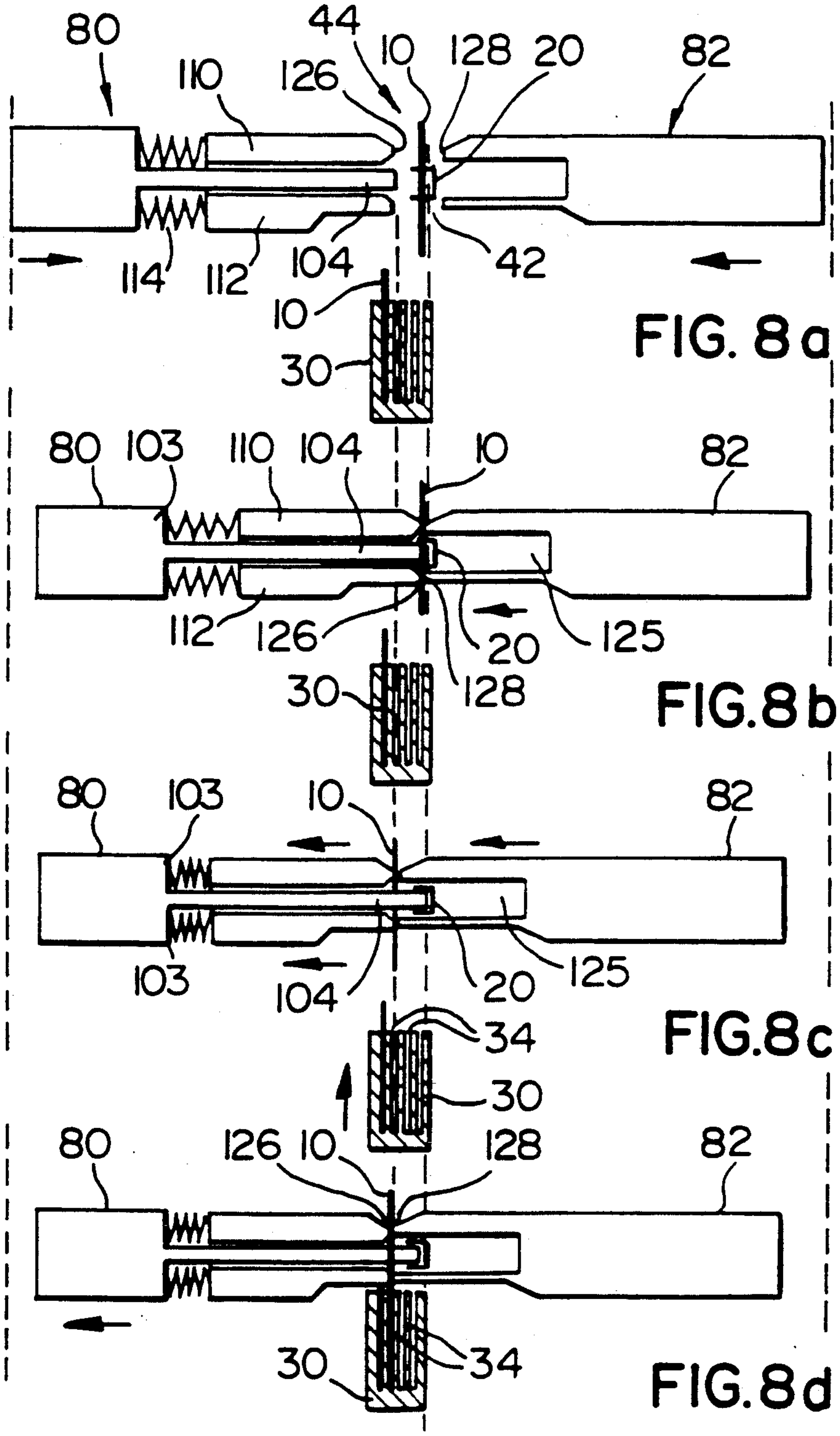
FIG. 8a to 8h show schematic side views of the operating members at different stages of operation of the apparatus.
Figures 8E, 8F, 8G, 8H:
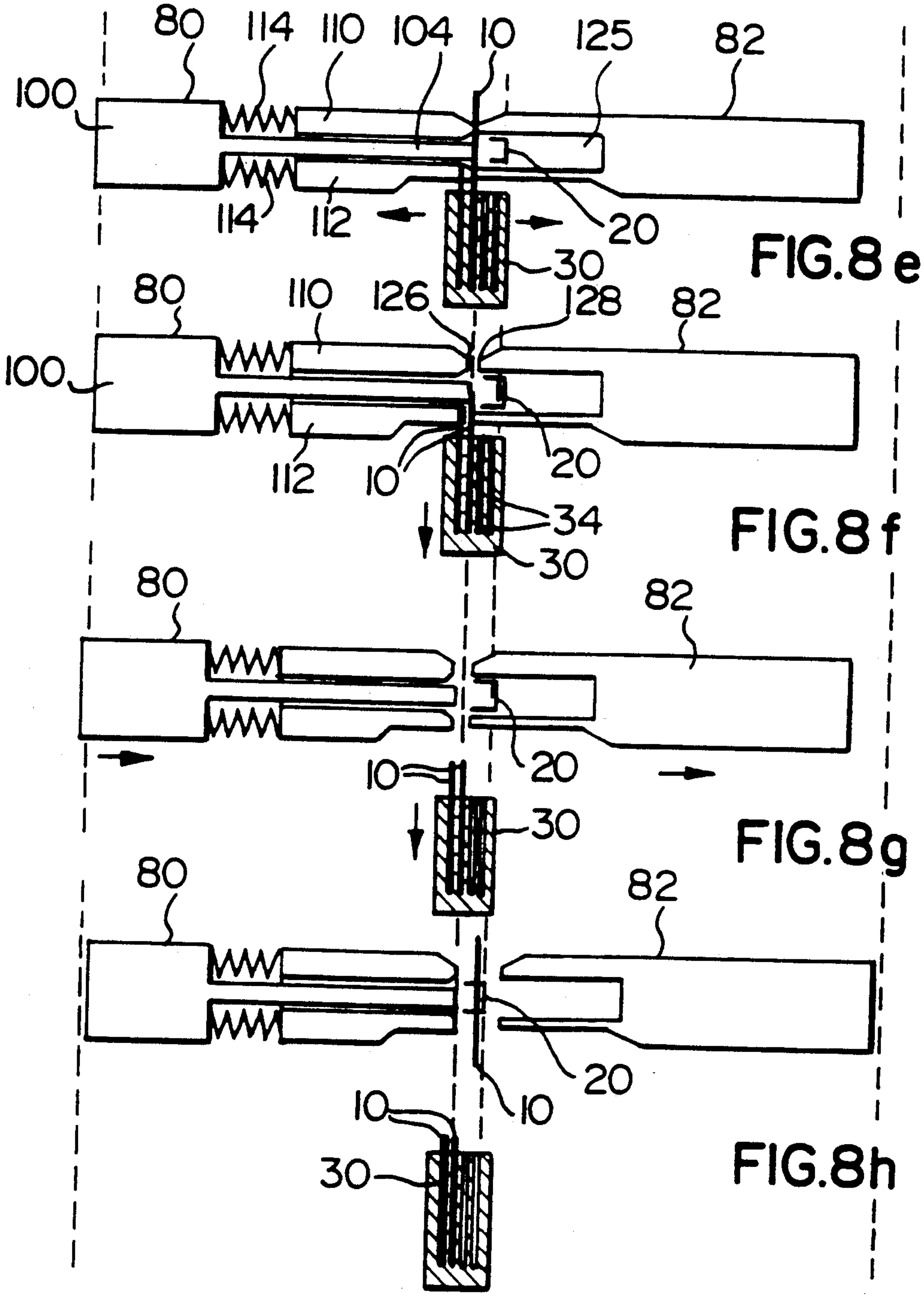
Figure 9:
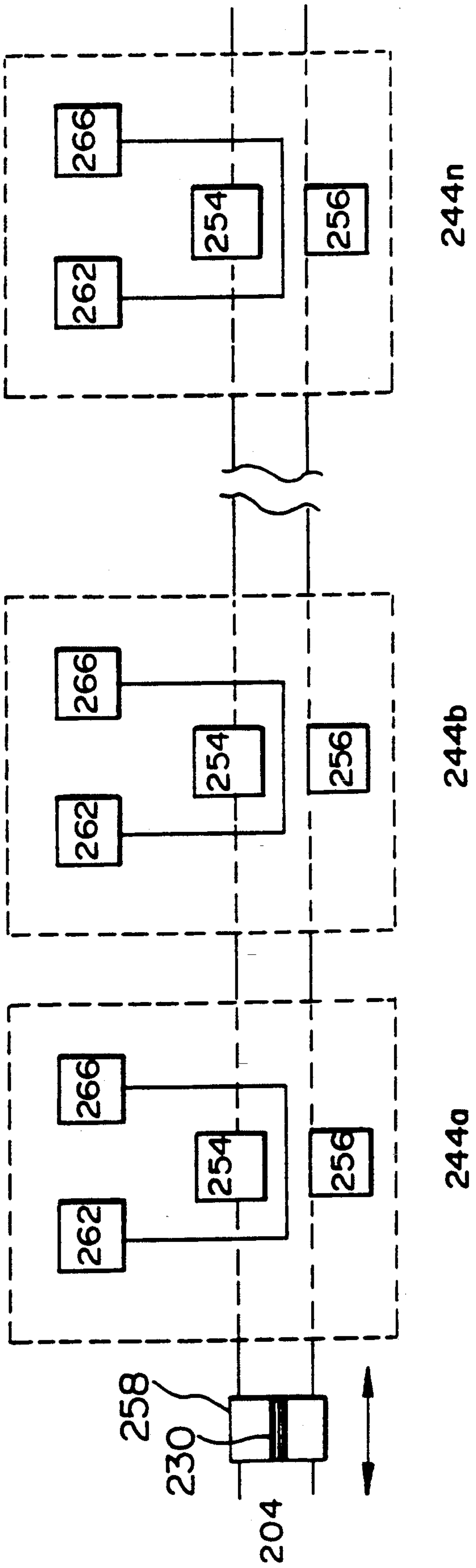
FIG. 9 shows a schematic plan view of an apparatus according to a second embodiment having a plurality of loading stations.

At commencement of operation, the parts are shown in their respective positions in FIG. 8*a* with the operating members 80 and 82 spaced apart on each side of the passline 42 and with the bandolier 20 lying along the passline 42 between the operating members 80 and 82. If no pins 10 are located in the loading station 44 between the operating members 80 and 82, the moving means operates to move the bandolier 20 along its passline 42 until a required number of the leading pins on the bandolier are disposed as a group in the loading station 44 with gaps between the pins 10 aligned with the tines 104 and with the pins aligned with the pin receiving grooves 129 of gripping surface 128 of operating member 82. The sequence of movement of the parts of the apparatus is then computer controlled in the following manner. The operating members 80 and 82 are moved towards each other into pin holding positions (FIG. 8*b*) by drive means 88 and 90 until upper and lower gripping surfaces 126 and 128 of the gripping members engage and grasp the group of pins at positions spaced apart above and below the bandolier (FIG. 8*b*). The operating member 82 then continues to move across the passline 42 effecting movement of the gripping members 110 and 112 towards the shoulders 103 of the main body portion 100 of operating member 80 which is now stationary (FIG. 8*c*). This causes compression of the springs 114 and forces the pins to move between the tines 104. During this movement, the tines 104 of the bandolier separating means enter the recess 125 to engage within the bandolier 20, thereby laterally moving the pins 10 relatively to the bandolier 20 and separating the pins 10 from the bandolier 20 (FIG. 8*c*). Further movement of the operating member 82 in the same direction relative to the main body portion 100 of operating member 80 positions pins of the group horizontally in desired locations with the pins 10 still gripped by gripping surfaces 128 and 126. At the same time, if the carrier block 30 is not already in the desired position, relative movement of the support 130 carrying the carrier block 30 may position the group of pins in a desired location relative to a row of holes in the carrier block 30. Then, relative movement of the support 130 towards the operating members 80 and 82 causes ends of the pins of the group to be received into holes 34 in the carrier block 30 (FIG. 8*d*) while the pins are still gripped between gripping surfaces 126 and 128. Operating members 80 and 82 are then moved apart, first by movement of the main body portion 100 of operating member 80 away from the passline while operating member 82 remains stationary (FIG. 8*d*–FIG. 8*e*) so as to retract the tines 104 from the recess 125, and from the bandolier 20, while the springs 114 urge the gripping members 110 and 112 towards the holding positions so as to maintain the pins in their desired positions. Once the tines have been retracted (FIG. 8*e*), the pins are released by further movement apart of both of the members 80 and 82 away from the holding positions to separate the gripping surfaces 126 and 128 by a small distance (FIG. 8*f*). The gripping surfaces 126 and 128 may guide the pins so as to allow them to fall into aligned holes 34 in the carrier block 30 (FIG. 8*f*). The carrier block 30 holding pins 10 is moved away from the operating members (FIG. 8*g*) and the operating members 80 and 82 are repositioned (FIG. 8*h*) as shown in FIG. 8*a*.

The above sequence of operations is then repeated as required to load the required number of pins into other desired locations in the carrier block. The sequence of moves for each 4×45 array of holes in a carrier block may be stored on file in the computer. Apertures 117 and 118 (FIG. 5) in gripping members 110 and 112 are provided so that during insertion of a second or subsequent row of pins into the carrier block, pins already held in the carrier block in adjacent rows can pass up through the apertures 117 and 118 in the gripping members 110 and 112 and between tines 104 of the bandolier separating means to allow positioning of the carrier block 30 close to the operating members 80 and 82 for loading of subsequent rows of pins. The apertures 117 and 118 are sufficiently large to enable the preceding row of pins in the block to remain in the apertures as the operating members 80 and 82 are moved apart from their pin holding positions so as to release the group of pins of the subsequent row.

When loading two or more rows of pins into the carrier block 30, the computer controlled stepper motors are operable to locate precisely the operating members 80 and 82 in slightly different horizontal positions from one sequence of operations to the next, to align the pins with different rows of pin locations in the carrier block.

In the sequence of operations above, simultaneous lateral positioning of the group of pins and separating of the bandolier by movement of operating member 82 while holding stationary the main body portion 100 of operating member 80 allows the bandolier to be separated from the pins and the pins to be laterally positioned precisely above a row of holes 34 in the carrier block 30, while the bandolier remains substantially aligned along the passline. However, alternative sequences of relative movement of both of the gripping means and of the carrier block positioning means may also be used to effect separation of the group of pins from the bandolier, alignment of the pins with the holes in the carrier block and insertion of ends of pins of the group into holes in the carrier block. For example, in another operational sequence (not shown) the pins of the group are held stationary between the gripping members and aligned along the passline and the main body portion 100 of operating member 80 is moved towards operating member 82 so as to move the bandolier separating means laterally of the passline to separate the bandolier from the group of pins. The carrier block is positioned horizontally and/or vertically to align the holes with and insert ends of the pins, while the bandolier separating means is retracted and then the pins are released to allow ends of the pins to fall further into aligned holes in the carrier block.

Figure 10:
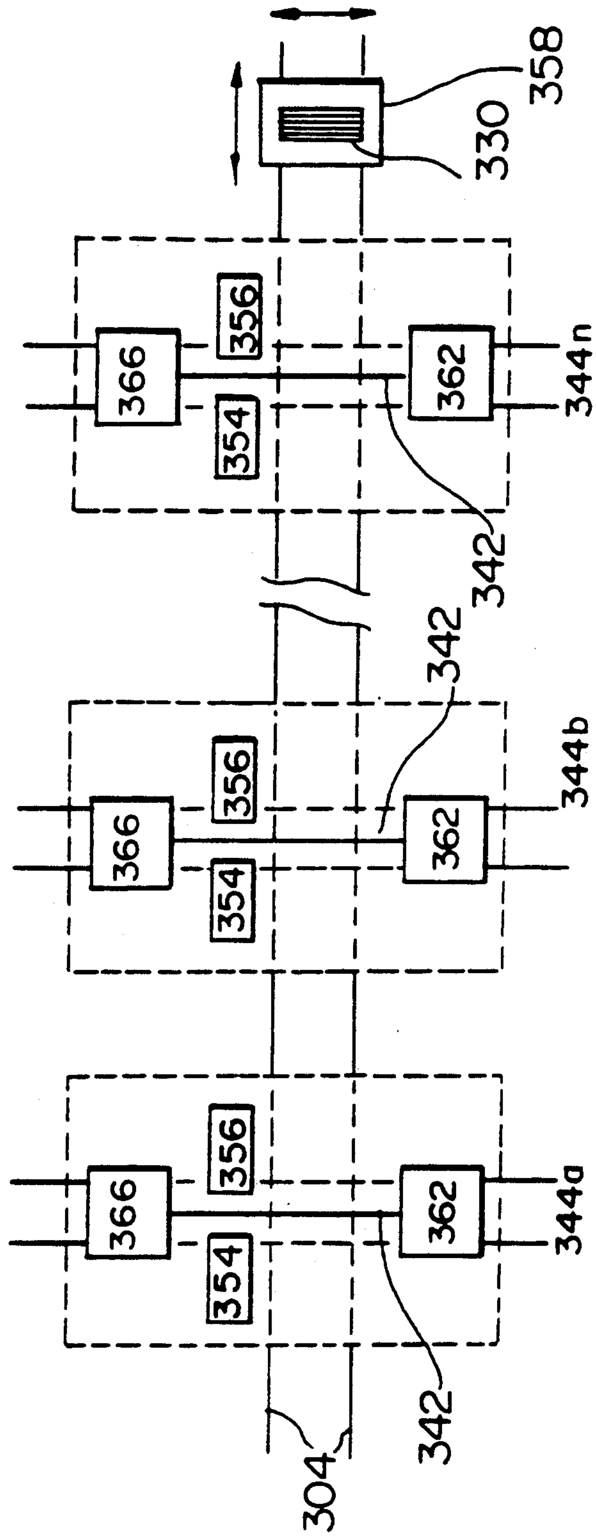
FIG. 10 shows a schematic plan view of an apparatus according to a third embodiment having a plurality of loading stations.

An apparatus according to a second embodiment of the invention, and as shown schematically in FIG. 10, comprises a plurality of pin loading stations 244*a*,244*b* . . . 244*n*, similar to the pin loading station 44 described in the first embodiment. Associated with each loading station is a bandolier supply reel station and drive means 262, a passline for bandolier 242, a bandolier take up means 266, and opposed heads 254 and 256, (similar to corresponding features 62, 42, 66 and 54 and 56 respectively of the first embodiment) and arranged side by side above a guide rail 204 of a carrier block positioning means 258. The carrier block positioning means 258 is operable to shuttle a carrier block 30 rapidly between loading stations 244*a*, 244*b*, . . . 244*n* along guide rails 204. A pin of a different size or type is passed into each loading station. Complex arrays of multiple types of pins may be loaded automatically into a carrier block by sequentially advancing groups of a desired number of each type of pin into each loading station and moving the carrier block sequentially to the appropriate loading station to load the groups of pins under computer control.

An apparatus according to a third embodiment is shown schematically in FIG. 11 and comprises a plurality of loading stations 344*a*, 344*b*, . . . 344*n*, similar to 244*a* . . . 244*n* of the second embodiment, except that they are arranged side by side so that passlines 342 for bandoliers carrying different types of pins lie side by side and parallel to one another as they pass through the loading stations. As with the second embodiment, associated with each loading station are features similar to those of the first embodiment: a bandolier supply reel station and drive means 362 and a bandolier take up means 366, and opposed heads 354 and 356. Movement of a carrier block 30 between loading stations is accomplished by a carrier block moving means 358 operable to shuttle the carrier block 330 laterally between loading stations 344*a*, 344*b*, . . . 344*n* along guide rail 304 which lies along side the loading stations and to move the carrier block along guide rails 302 of each loading station which lie parallel to each of the bandolier passlines 342 and perpendicular to the guide rail 304.

We claim:

1. An apparatus for loading pins into a carrier block, the apparatus including a pin loading station and comprising:

- means for intermittently moving a bandolier along a passline through the pin loading station to locate groups of pins carried on the bandolier sequentially in the pin loading station;
- means for gripping pins of a group in the pin loading station, the gripping means having opposed gripping members which are relatively movable towards each other into pin holding positions to hold the pins and away from the pin holding positions to release the pins;
- motor drive means for moving the gripping members laterally of the passline and towards and away from the holding positions;
- bandolier separating means operable to cause relative movement of the bandolier and pins of the group held in the loading station when the gripping members are in the holding positions whereby the bandolier is detached from the group of pins;
- carrier block positioning means, having a support for the carrier block, the carrier block positioning means and the gripping members being operable to cause relative movement of the gripping members and the support from positions apart to positions closer together while the gripping members are in the holding positions, to cause ends of pins of the group held in the pin loading station to be received in the pin receiving locations within the carrier block, the gripping members then being movable from the pin holding positions to release the pins with the gripping members and the support in their positions closer together; and,
- means for controlling the motor drive means to cause movement of the gripping members towards and away from the pin holding positions and to cause movement of the gripping members after reaching their pin holding positions, together in the same direction laterally of the passline, selectively to any of a plurality of desired locations while maintaining the relative pin holding positions of the gripping members, and before moving the support and the gripping members into their positions closer together.

2. An apparatus according to claim 1 or any of claims 16 to 19 wherein on one side of the passline, the gripping means is formed with an apertured region, the apertured region provided to allow ends of a row of pins previously inserted into and projecting from a carrier block to pass into the apertured region during movement of the support and the gripping members to the positions closer together and to remain in the apertured region during subsequent movement of the gripping members from the pin holding positions.

3. An apparatus according to claim 1 wherein the bandolier separating means comprises a plurality of tines spaced apart along the passline, the tines movable across the passline with the gripping members in the holding positions so as to move between the pins and engage the bandolier to separate it from the pins.

4. Apparatus for loading a plurality of groups of pins into a carrier block, the apparatus having a plurality of pin loading stations, and comprising in respect of each pin loading station;

- means for intermittently moving a bandolier along a passline through the pin loading station to locate groups of pins carried on the bandolier sequentially in the pin loading station;
- means for gripping pins of a group in the pin loading station, the gripping means having opposed gripping members which are relatively movable towards each other into pin holding positions to hold the pins and away from the pin holding positions to release the pins;
- motor drive means for moving the gripping members laterally of the passline and towards and away from the holding positions;
- bandolier separating means operable to cause relative movement of the bandolier and pins of the group held in the loading station when the gripping members are in the holding positions whereby the bandolier is detached from the group of pins;
- the apparatus also including carrier block positioning means, having a support for the carrier block, the carrier block positioning means and the gripping members being operable to move the support from one pin loading station to another and, with the support disposed in any particular pin loading station, the support and the gripping members are relatively movable from positions apart to positions closer together while the gripping members are in the holding positions, to cause ends of pins of a group held in the particular pin loading station to be received in pin receiving locations within the carrier block, the gripping members then being movable from the pin holding positions to release the pins with the gripping members and the support in their positions closer together; and,
- means for controlling the motor drive means to cause movement of the gripping members towards and away from the pin holding positions and to cause movement of the gripping members after reaching their pin holding positions, together in the same direction laterally of the passline, selectively to any of a plurality of desired locations while maintaining the relative pin holding positions of the gripping members, and before moving the support and the gripping members into their positions closer together.

5. Apparatus according to claim 4 wherein, in respect of at least one pin loading station, one gripping member is formed with an apertured region provided to allow ends of pins previously inserted into and projecting from the carrier block to pass into the apertured region during movement of the support and the gripping members to their positions closer together and to remain in the apertured region during the subsequent movement of the gripping members from the pin holding positions.

6. An apparatus according to claim 4 wherein parts of the passline which pass through their respective pin loading stations are longitudinally disposed of the passlines from one passline to another and the carrier block positioning means is operable to move the carrier block along the direction of the passline.

7. An apparatus for loading pins into a carrier block, the apparatus including a pin loading station and comprising:

means for intermittently moving a bandolier along a passline through the pin loading station to locate groups of pins carried on the bandolier, sequentially in the pin loading station;

means for gripping pins of a group in the pin loading station, the gripping means having opposite gripping members which are movable laterally of the passline and relatively movable towards each other into pin holding positions to hold the end portions of the pins and away from the pin holding positions to release the pins;

stepper motors for causing movement of the gripping members;

bandolier separating means operable to cause relative movement of the bandolier and pins of the group held in the loading station when the gripping members are in the holding positions whereby the bandolier is detached from the group of pins;

carrier block position means, having a support for the carrier block, the carrier block positioning means and the gripping members being operable to cause relative movement of the gripping members and the support from positions apart to positions closer together while the gripping members are in the holding positions, to cause ends of pins of the group held in the pin loading station to be received in the pin receiving locations within the carrier block, the gripping members then being movable from the pin holding positions to release the pins with the gripping members and the support in their positions closer together; and means to control the stepper motors to cause movement of the gripping members towards and away from the holding positions and to cause movement of the gripping members after reaching their pin holding positions, together in the same direction laterally of the passline, selectively to any of a plurality of desired locations while maintaining their relative pin holding positions, and before moving the support and the gripping members to their positions closer together.

8. An apparatus for loading pins into a carrier block, the apparatus including a pin loading station and comprising:

means for intermittently moving a bandolier along a passline through the pin loading station to locate groups of pins carried on the bandolier sequentially in the pin loading station;

means for gripping pins of a group in the pin loading station, the gripping means including two heads opposed across the passline, each head carrying a rigid member provided upper and lower gripping members which oppose corresponding upper and lower gripping members of the opposing rigid member, each gripping member providing gripping surfaces and being relatively movable towards the opposing gripping member into pin holding positions to hold the pins and away from the pin holding positions to release the pins, the gripping surfaces of the opposing gripping members facing across the passline for engaging opposite sides of the pins at positions, spaced apart axially along a pin;

one rigid member having a main body portion extending to a narrow planar portion, with upper and lower gripping members being slidably mounted upon sides of the narrow planar portion, the narrow planar portion providing a bandolier separating means comprising a plurality of tines spaced apart along the passline and movable laterally across the passline with the gripping members in the holding positions to move between the pins and engage the bandolier to cause relative movement of the bandolier and the pins of the group held in the loading station when the gripping members are in the holding position, whereby the bandolier is separated from the group of pins; and carrier block positioning means, having a support for the carrier block, the carrier block positioning means and the gripping members being operable to cause relative movement of the gripping members and the support from positions apart to positions closer together while the gripping members are in the holding positions, to cause ends of pins of the group held in the pin loading station to be received in the pin receiving locations within the carrier block, the gripping members then being movable from the pin holding positions to release the pins with the gripping members and the support in their positions closer together.

9. An apparatus according to claim 8 wherein said slidably mounted gripping members are resiliently biased towards ends of the tines.

10. An apparatus for loading pins into a carrier block, the apparatus including a pin loading station and comprising:

means for intermittently moving a bandolier along a passline through the pin loading station to locate groups of pins carried on the bandolier sequentially in the pin loading station;

means for gripping pins of a group in the pin loading station, the gripping means having opposed gripping members which are relatively movable towards each other into pin holding positions to hold the pins and away from the pin holding positions to release the pins, a pair of gripping members being provided on each side of the passline, said pair of gripping members providing gripping surfaces extending along and spaced apart above and below the passline, the pairs of gripping members being movable into their pin holding positions to grip spaced apart opposite end portions of the pins;

bandolier separating means operable to cause relative movement of the bandolier and pins of the group held in the loading station when the gripping members are in the holding positions whereby the bandolier is detached from the group of pins, the bandolier separating means comprising a plurality of tines operable to slide between the pin gripping surfaces of one pair of gripping members, and between opposed gripping surfaces of the other pair of gripping members while the gripping members are in the pin holding positions whereby the tines engage and urge the bandolier laterally of pins held in the loading station so as to separate the bandolier from the pins;

carrier block positioning means, having a support for the carrier block, the carrier block positioning means and the gripping members being operable to cause relative movement of the gripping members and the support from positions apart to positions closer together while the gripping members are in the holding positions, to cause ends of pins of the group held in the pin loading station to be received in the pin receiving locations within the carrier block, the gripping members then being movable from the pin holding positions to release the pins with the gripping members and the support in their positions closer together.

11. An apparatus for loading pins into a carrier block, the apparatus including a pin loading station and comprising:

means for intermittently moving a bandolier along a passline through the pin loading station to locate groups of pins carried on the bandolier sequentially in the pin loading station;

means for gripping pins of a group in the pin loading station, the gripping means having opposed pairs of gripping members which are relatively movable towards each other into pin holding positions to hold the pins and away from the pin holding positions to release the pins, the gripping members providing on each side of the passline, upper and lower gripping surfaces extending along the passline, the upper and lower gripping surfaces being spaced apart above and below the passline, and the gripping members being movable into their pin holding positions to engage gripping surfaces with spaced apart opposite end portions of the pins;

bandolier separating means operable to cause relative movement of the bandolier and pins of the group held in the loading station when the gripping members are in the holding positions whereby the bandolier moves laterally between upper and lower gripping surfaces and is detached from the group of pins; and carrier block positioning means, having a support for the carrier block, the carrier block positioning means and the gripping members being operable to cause relative movement of the gripping members and the support from positions apart to positions closer together while the gripping members are in the holding positions, to cause ends of pins of the group held in the pin loading station to be received in the pin receiving locations within the carrier block, the gripping members then being movable from the pin holding positions to release the pins with the gripping members and the support in their positions closer together.

* * * * *